United States Patent [19]

Saito et al.

[11] Patent Number: 4,831,963
[45] Date of Patent: May 23, 1989

[54] PLASMA PROCESSING APPARATUS

[75] Inventors: Hiroshi Saito, Fujisawa; Shinji Sasaki, Yokahama, both of Japan

[73] Assignee: Hitachi, Ltd., Tokyo, Japan

[21] Appl. No.: 9,685

[22] Filed: Feb. 2, 1987

[30] Foreign Application Priority Data

Feb. 4, 1986 [JP] Japan .................................. 61-021254

[51] Int. Cl.$^4$ ............................................. C23C 16/00
[52] U.S. Cl. .................................... 118/723; 118/720; 118/50.1; 204/164
[58] Field of Search ................... 204/192.12, 298, 164; 156/345; 118/720, 723, 50.1; 427/47, 45.1

[56] References Cited

U.S. PATENT DOCUMENTS

| | | | |
|---|---|---|---|
| 4,101,411 | 7/1978 | Suzuki et al. | ........................ 204/298 |
| 4,298,419 | 11/1981 | Suzuki et al. | .................... 204/298 X |
| 4,401,054 | 8/1983 | Matsuo et al. | .................. 204/164 X |
| 4,450,031 | 5/1984 | Ono et al. | ........................ 204/298 X |
| 4,559,100 | 12/1985 | Ninomiya et al. | .............. 204/298 X |
| 4,585,541 | 4/1986 | Miyake et al. | ....................... 204/298 |

Primary Examiner—Nam X. Nguyen
Attorney, Agent, or Firm—Antonelli, Terry & Wands

[57] ABSTRACT

A plasma processing apparatus which is effective for surface processing uses a reactive gas activated by plasma excited by microwave energy. Generation and maintaining of the plasma excited by the microwave energy are different where pressure in the gas chamber is above 0.1 Torr. Generating a high density plasma and maintaining the plasma includes the use of a protrudent window which extends into the activating chamber which also operates as a cavity resonator. Oxidation of resist formed on the surface of VLSI may be provided and damage by charge particles prevented by use of a magnetic field.

7 Claims, 4 Drawing Sheets

PLASMA PROCESSING APPARATUS

BACKGROUND OF THE INVENTION

The present invention relates to a plasma processing apparatus by low temperature plasma and more particularly to an oxidizer in which the activated gas is sent onto a samples and thereby photo resist, etc. formed on the sample surfaces is removed.

A plasma processing apparatus of the prior art, for example, as described in the bulletin of the Japanese Laid-Opened Patent No. 52-11175, proposes a method where an activating chamber made of quartz is provided to a part of a microwave cavity resonator, the oxygen gas is supplied as the raw material gas to this activating chamber and the interior is then evacuated to the predetermined degree of vacuum, the plasma is generated within the activating chamber by supplying the microwave power and the resist is oxidized by supplying the activated oxygen which is also excited by such plasma to the reactor chamber.

In the case of this method, distance between the activating chamber and reactor chamber is comparatively long. Therefore, the plasma is eliminated before it is supplied to the reactor chamber and the resist is oxidized only by the activated oxygen. Therefore, damage is not generated on the samples by plasma but the activated oxygen is also eliminated during transfer and a ratio of activated oxygen within the reactor chamber is remarkably reduced in comparison with that in the activating chamber. Concerning this point, reduction in lowering of concentration during transfer has been considered by selecting a kind of substance to be activated and a substance which collides therewith but it has been unavoidable that concentration of activated oxygen is lowered during transfer.

An apparatus of the prior art which has solved above problem is disclosed in the Japanese Laid-Opened Patent No. 56-96841. In this prior art, supply of activated oxygen is suspended in order to prevent reduction in concentration due to the supply, plasma is generated within the reactor chamber using microwave and processing speed is increased by oxidizing the resist at the activated oxygen generating region. However, the method described above does not consider damages on samples by plasma.

The prior art for solving this problem, a technique is disclosed in the Japanese Laid-Opened Patent No. 57-76844. This prior art discloses that a metal plate which screens the microwave is provided at the upper part of samples wihtin the reactor chamber in order to screen the microwave and plasma at the upper part of samples, and thereby prevents damage of samples by plasma. However, in this apparatus, since the activating chamber and the reactor chamber are located in the same chamber, the charged particles in the plasma collide with said metal plate for plasma screening and thereby the surface of metal plate is subjected to the sputtering phenomenon, material particles of metal plate are emitted to the interior of reactor chamber and these particles adhere to the samples, resulting in contamination.

BRIEF SUMMARY OF THE INVENTION

Procedures for preventing damage by plasma in prior art mentioned above will result in drop of processing speed or contamination by impurity. Meanwhile, effort for increasing the processing speed brings about damage by plasma. The prior art cannot provide a resist oxidizer which assures high processing speed and eliminates damage by plasma and moreover contamination by impurity, sacrificing processing speed and thereby resulting in bad productivity in the plasma processing technique.

Therefore it is an object of the present invention to provide a resist oxidizer which assures high processing speed, eliminates contamination by impurity and damage by plasma.

This object can be achieved by providing an activating chamber which has a microwave introducing window and is formed to a microwave cavity resonator in order to activate raw material gas, a transportation pipe which connects the activating chamber and the reactor chamber within a short distance, and a charged particle eliminating means which is provided between said activating chamber and the reactor chamber and supplies only the activated gas to the reactor chamber by eliminating electrons and ions within the plasma. As such eliminating means, a field generator or a metal plate having a hole is used.

It is more desirable that the microwave absorption efficiency to plasma is improved through enlargement of the contact area between the microwave and plasma by providing a microwave introducing window member having a large surface area while the microwave cavity resonator is formed and simultaneously concentration for activation of reactive gas can also be improved by enlarging the high density plasma generating region. Thereby, the plasma processing such as high speed elimnation of resist can be realized while preventing damage of samples, particularly a VLSI element.

Under the no-field condition, the microwave is capable of supplying energy to the plasma until plasma density reaches $7.4 \times 10^{10}$ ions/cm$^3$. Above plasma density is the cut-off density for the incident microwave of 2.45 GHz and under such plasma density, the microwave can no longer enter the plasma and is reflected, resulting in saturation of energy supply by microwave.

Therefore, in case plasma density is sufficiently lower than said value, in more practical, The activating chamber works as a resonator and stably generates plasma. The raw material gas activated by plasma behaves as the vicous flow or transition flow under the pressure of 0.1 Torr to 10 Torr. The activated gas is transported for the distance shorter than that of prior art in order to prevent drop of concentration. Only the activated neutral gas is sent to the samples by charged particle separating means for the oxidization. Thereby, the charged particles in the activated gas are not transported to the reactor chamber even when a total amount of activated gas increases.

In more practical, the molecules of reactive gas, for example, oxygen gas $O_2$ or mixed gas of oxygen and carbon tetrafluoride which has been introduced into the plasma are activated by plasma and are mainly transported to the sample surfaces along the flow of vacuum exhaustion. Therefore, if only the transportation distance is reduced in order to keep concentration of activated reactive gas even during transportation, the charged particles in the plasma reach the samples before they lose the life, giving damages to the samples. In a preferred embodiment of the present invention, therefore, a field generating means is provided near the transportation pipe in view of forming a magnetic field which orthogonally crosses the transportation direction of activated gas. The electrons among the charged particles are trapped by such magnetic field, while the ions are deflected in the travelling direction. Thereby the charged particles do not reach the samples and the samples, particularly VLSI's are freed from damage. Moreover, high speed oxidization can be realized by the activated neutral reactive gas with high concentration.

In the case where a metal plate having a hole is used as the charged particles eliminating means, the grid effect of metal plate having a predetermined diameter and a hole of predetermined length is used, in place of said magnetic field. The charged particles flow into the metal plate because the reactive gas is caused to pass through the metal plate and these charged particles are not transported to the samples passing through such metal plate.

Problems resulting from generating and maintaining the plasma having the density larger than $7.4 \times 10^{10}$ ions/cm$^3$ are explained by referring to the experiments for generation of plasma by microwave conducted by the inventors of the present invention.

In case the plasma is generated and maintained by the microwave under the condition that the magnetic field is not generated, change of plasma density is shown in FIG. 4 and FIG. 5.

FIG. 4 illustrates distribution of plasma density obtained by measuring it toward the introducing direction from the microwave introducing window in case the plasma is generated and maintained by introducing the microwave of 2.45 GHz within the activating chamber with O$_2$ gas pressure of 0.2 Torr. For measurement of electron density, the Langmuir probe is used. In this experiment, electron density is equal to ion density since the ion is considered to be univalent. This electron density is generally called the plasma density.

As can be understood from FIG. 4, the plasma density at the area away from the microwave introducing window by 10 mm is $2 \times 10^{10}$ ions/cm$^3$, but it is lowered exceeding three digits like $1 \times 10^7 1/$cm$^3$ at the area away from it by 100 mm. It is one of the causes of such phenomenon that the density of plasma at the microwave introducing window is the cut-off density for the incident microwave of 2.45 GHz and thereby the microwave is reflected therefrom. Moreover, it is also one of causes that concentration of plasma at the area far from the micro wave introducing window is also lowered since the plasma reduces its own energy while it diffuses from the area near the microwave introducing window due to collision with the ambient particles. Namely, when a gas pressure in the reactor chamber is ranged from 0.1 Torr to 10 Torr, average free path of molecules of ambient gas and plasma is immediately attenuated and accordingly the plasma in the reactor chamber reduces its density in the area except for the microwave introducing window.

FIG. 5 illustrates distribution of electron density at the area away from the microwave introducing window by 10 mm when the oxygen O$_2$ gas pressure is changed. This figure indicates that plasma density reduces when the oxygen O$_2$ gas pressure becomes high. Namely, even when the O$_2$ gas pressure is increased by one digit to raise the gas molecule concentration also by one digit, the plasma density is reduced by about two digits at the area being far from the microwave introducing window by 10 mm. Therefore, a large amount of reactive gas must pass the area near the microwave introducing window in order to activate the reactive gas by plasma. For this purpose, it is essential to increase the surface area of the microwave introducing member.

From foregoing experimental results, the second to fourth embodiments of the present invention arrange the microwave introducing window member having a large surface area within the activating chamber which also works as the microwave cavity resonator. Here, said microwave introducing window member is protruded to the reactor chamber so that the reactive gas introduced into the activating chamber always passes the enhanced high density plasma region (plasma density is $7.4 \times 10^{10}$ ions/cm$^3$) near the microwave introducing window member. The reactive gas is supplied from the side where the microwave for the activating chamber is introduced. The interval between the inner wall of the activating chamber and the microwave introducing window member should be narrow as much as the gas pressure of activating chamber is higher. When gass pressure is considered as P Torr, said interval as t mm, the relation, $t \leq 50/\sqrt{P}$, more desirably $t \leq 10/\sqrt{P}$ is necessary. This approximation can be realized practically under the pressure of 0.1 Torr to 10 Torr.

DETAILED DESCRIPTION OF THE PREFERRED EMBODIMENTS

Figure 1:
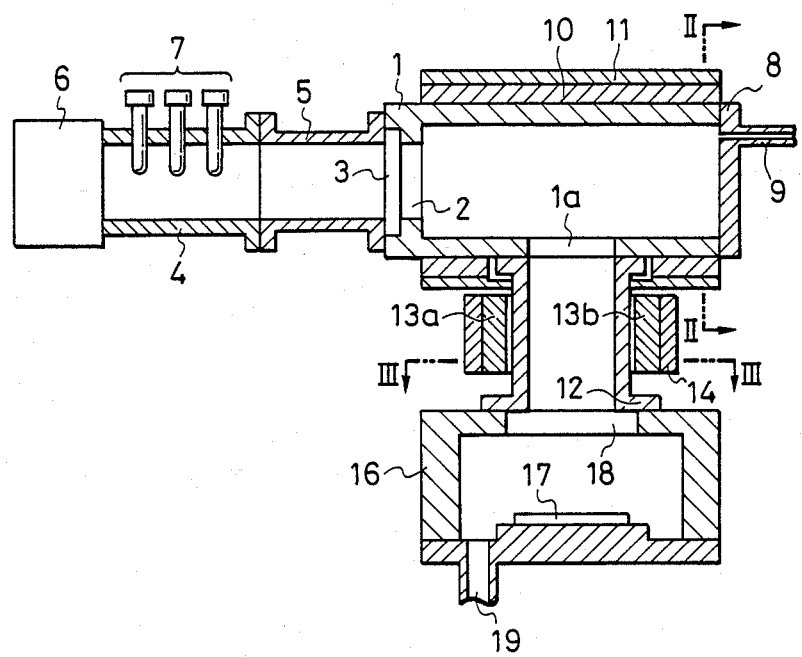
FIG. 1 is a sectional view of side elevation of the first embodiment of the present invention.

The first embodiment of the present invention is explained with reference to FIG. 1 to FIG. 4. In FIG. 1, the activating chamber 1 is provided with a window 2 at its side end and also is provided with an opening 1a at the bottom thereof. The plasma is generated within the activating chamber 1 by the microwave energy (generated generally by the magnetron of 2.45 GHz) sent from the microwave generator (source) 6 described later being connected through the window 2. The activating chamber 1 is formed in such size and shape as function as the microwave cavity resonator which is suited to the microwave frequency to be used. The window 2 comprises the window member consisting of quartz or alumina ceramics so that it allows the microwave to transmit therethrough and keeps a degree of vacuum within the activating chamber 1.

A microwave oscillator tube 4 is coupled, at its one ended to the end face of the activating chamber 1 in the side of window 2 through the waveguide 5, while to the microwave source 6 at its other end. Moreover, at a part of the side surface, a tuner 7 consisting of a plurality of members arranged with an interval in the direction of axial center is also provided. This plurality of tuner members are preset so that the impedance for of microwave emitted into the activating chamber 1 from the microwave source 6 is matched with the impedance of the activating chamber 1 preset as the microwave cavity resonator.

A flange 8 is coupled to the end face opposing to the window 2 of activating chamber 1 and fixes the end face of material gases providing pipe connected to the raw material gases source (not shown) to be used for plasma processing.

Figure 2:
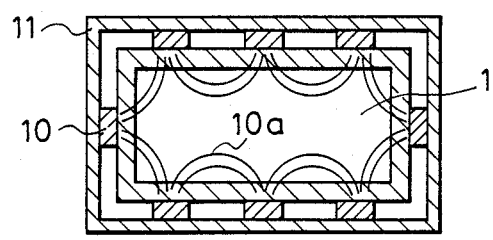
FIG. 2 is a transverse sectional view along the line II—II in FIG. 1.

A plurality of permanent magnets 10 are inserted with interval between the external circumference of activating chamber 1 and the yoke 11 surrounding such circumference in such a manner that magnetic poles are alternately different and thereby the adjacent lines of magnetic force are formed arcuately 10a on the internal circumference of the activating chamber 1 as shown in FIG. 2. The multipole cusp field is generated and thereby it is lowered that the charged particles collide with the surface of internal wall. Accordingly, it can be prevented that plasma density is lowered because wall material of activating chamber mixes into activated gases an impurity due to the sputtering phenomenon of the charged particles.

Figure 3:
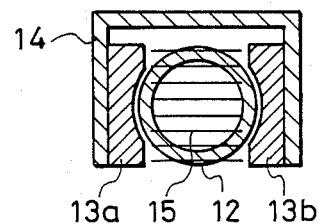
FIG. 3 is a transverse sectional view along the line III—III in FIG. 1.
Figure 4:
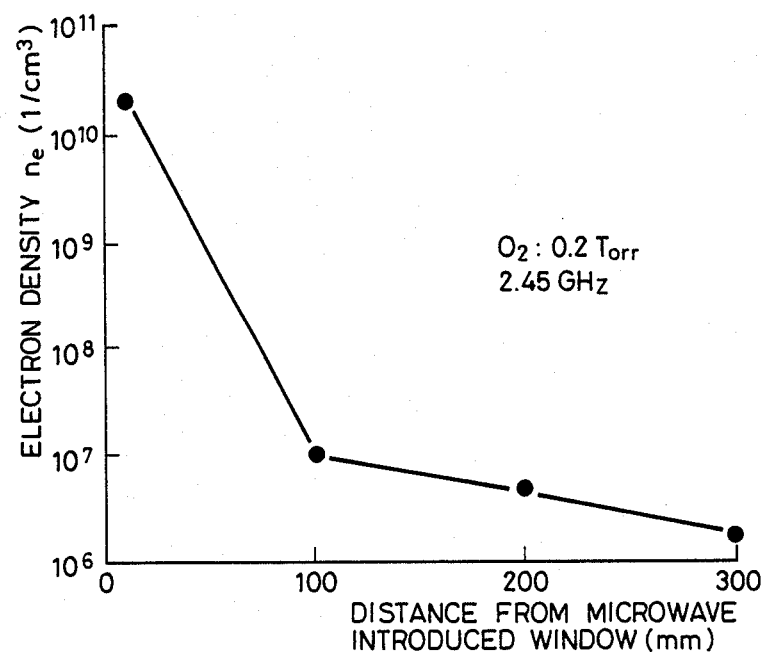
FIG. 4 is plasma density distribution measured in the microwave introducing direction when plasma is generated by introducing the microwave of 2.45 GHz into the O$_2$ gas ambience with pressure of 0.2 Torr.
Figure 5:
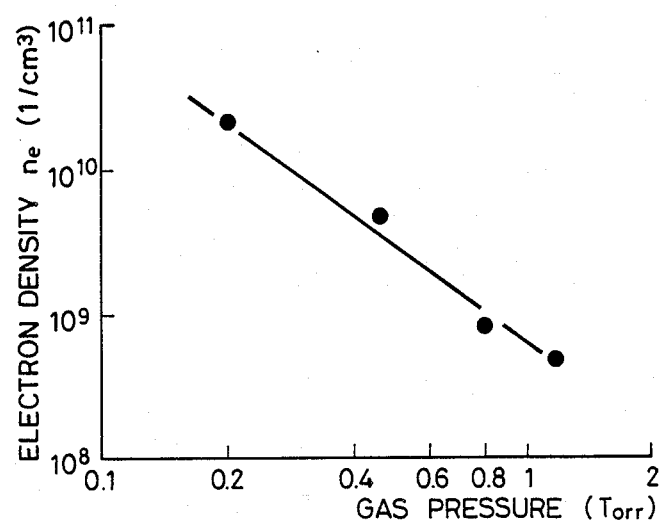
FIG. 5 illustrates change of plasma density at the region near the microwave introducing window in accordance with change of pressure of O$_2$ gas.

The one end of transportation pipe 12 is respectively connected to the opening 1a at the bottom of activating chamber 1, while the other end to the reactor chamber 16 described later. The reactive gas sent from the activating chamber 1 is transported into the reactor chamber 16. A pair of magnets 13a, 13b are provided between the external circumference of the transportation pipe 12 and the yoke 14 which surrounds the circumference of said pipe and are arranged so that the lines of magnetic force 15 becomes the right angle to the transportation direction as shown in FIG. 3.

The reactor chamber 16 places a sample 17 therein, provides an opening 18 at the opposed side for connection with the transportation pipe 12 and moreover allows the end of exhaust pipe 19 which is connected to an exhaust pump (not shown) to be fixed to its bottom part.

The raw material gases which are introduced from the raw material gas source and is used for plasma processing are supplied to the activating chamber 1 passing the material gas providing pipe 9 and is then exhausted from the exhaust pipe 12 passing through the transportation pipe 12 and the reactor chamber 16. Thereby, the inside of activating chamber 1 is kept at the predetermined degree of vacuum, for example, of about 0.1 Torr to 10 Torr.

When the microwave is applied to the activating chamber 1 passing through the microwave oscillator tube 4, waveguide 5 and microwave introduction window member 3 from the microwave source 6, the standing wave is generated within the activating chamber 1 and the raw material gas (for example, oxygen gas or mixing gas of oxygen and carbon tetrafluoride) which is the ambient gas starts the discharging by such electric field. As a result, the material gas is ionized thereby generating a plasma which is trapped by the multipole cusp field formed by the permanent magnet 10. The sputtering at the internal wall of activating chamber 1 by the charged particles in the plasma can be suppressed by such field. Moreover, since the charged particles which disappear through collision with the internal wall are reduced, plasma density in the activating chamber 1 is as much improved.

The charged particles and activated gas in the plasma generated in the activating chamber 1 are transported to the reactor chamber 16 passing through the transportation pipe 12. The charged particles are trapped by the lines of magnetic force 15 formed by a pair of magnets 13a, 13b, while the electrons are caused to make cyclotron movement and the ions are deflected. Thereby these particles cannot reach the surface of sample 17.

Thereby, the distance between the activating chamber 1 and reactor chamber 16 can be reduced to such a degree as providing a pair of magnets 13a, 13b and drop of concentration on the sample 17 can be prevented.

Therefore, according to the plasma processing apparatus of the embodiment of the present invention, since the activated gas in high concentration can be supplied onto the sample 17 by the high density plasma, the processing speed can be improved. Moreover, since charged particles in the plasma are perfectly separated by the magnetic field, the sample is not damaged by plasma. In addition, since plasma in the activating chamber is trapped by the multipole cusp field formed by a plurality of permanent magnets, sputtering at the internal wall of the activating chamber by the charged paticles in the plasma is remarkably reduced, and contamination of sample by impurity emitted from the internal wall of activating chamber can also be lowered.

Figure 6:
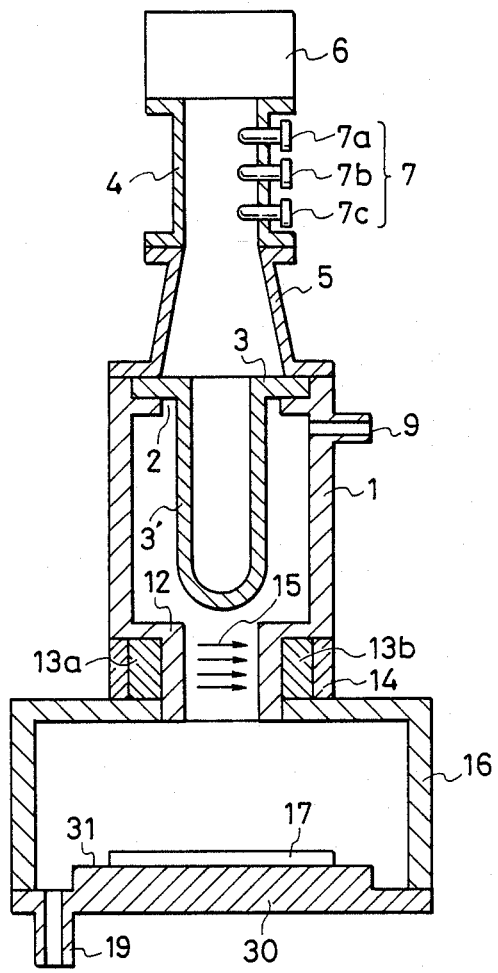
FIG. 6 is a sectional view of side elevation of the second embodiment of the present invention.
Figure 7:
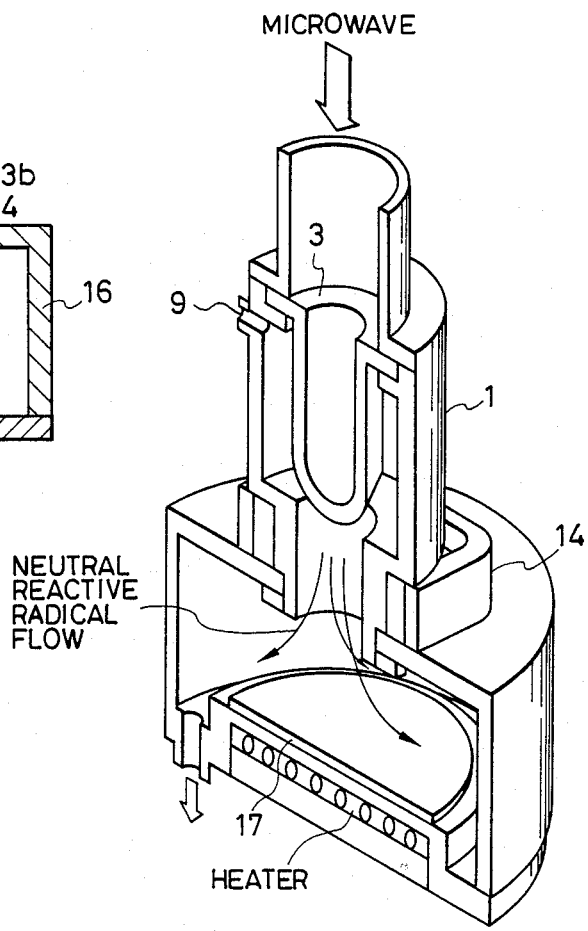
FIG. 7 is a sectional perspective view of the second embodiment shown in FIG. 6.

Other embodiments of the present invention are explained with reference to FIG. 6 to FIG. 9. FIG. 6 and FIG. 7 show a second embodiment of the present invention.

The activating chamber 1 is provided at the one end with a microwave introducing window 2. A part of the microwave introducing window member 3 is protruded into the activating chamber 1. The other end of activating chamber 1 is provided with the transportation pipe 12 in such a size as cutting off the incident microwave. Like the first embodiment, the activating chamber 1 allows formation of the cavity resonator for incident microwave and further provides the permanent magnets 13a, 13b and the yoke 14 at the external side of the transportation pipe 12 with the view of forming said orthogonal magnetic fields.

The activating chamber 1 is also provided with the material gas providing opening 9. The exit of transportation pipe 12 is connected with the reactor chamber 16. Meanwhile, the vacuum exhaust opening 19 is provided at the periphery of flange 30 of the reactor chamber, while the stage 31 for placing sample 17 is also provided at the center thereof. In addition, the waveguide 4 connecting the tuner for matching the impedance of the activating chamber 1, the connecting microwave transmission line 5 and the microwave source 6 is also coupled to the side of microwave introducing window 2 of the activating chamber 1.

With foregoing structure, the reactive gas is supplied from the material gas providing opening 9 and it is then exhausted at the predetermined pressure (0.1 Torr to 10 Torr in the oxidizing process) from the vacuum exhaust opening 19. Here, the microwave is generated from the microwave source 6 and the microwave applied is matched at the impedance with the activating chamber 1 by the stubs 7a, 7b of the tuner 7. Thereby, the microwave enters the activating chamber 1 through the microwave introducing window member 3, then forms the standing wave therein and starts discharge. Namely, the electrical field of the standing wave ionizes the reactive gas supplied from the material gas providing opening 9 and then generates plasma.

The plasma generated with start of discharge absorbs energy of microwave and thereby plasma density quickly reaches the cut-off density, resulting in the steady state of plasma. In the case of this embodiment, since the surface area of microwave introducing window member 3 is increased by providing the protruberance portion 3' thereto, the microwave enters the activating chamber 1 from the entire part of the protruberance portion 3', supplying energy to the plasma of reactive gas. Thereby, the region near the surface of protuberance portion has a high plasma density (density; $7.4 \times 10^{10}$ ions/cm$^3$). The reactive gas activated by this plasma passes through the transportation pipe 12 with the flow of the vacuum exhaustion and is then sent to the sample 17. In this case, the charged particles in the activated reactive gas are interfered to pass therethrough due to the lines of magnetic force 15 formed by a pair of magnets 13a, 13b provided at the external circumference of the transportation pipe 12 and do not reach the sample 17.

As explained above, according to the second embodiment of the present invention, the plasma generating area can be widened within the activating chamber and the microwave energy can be absorbed efficiently by the plasma by enlarging the microwave absorbing area. As a result, a large amount of high density plasma can be generated within the activating chamber and thereby high density activated reactive gas can be produced. This reactive gas is transported within a short distance in order to keep high concentration. The charged particles are eliminated in this case and only the neutral activated reactive gas is transported to the sample. The atom X becomes radical X* when it is excited but is means activated X in the foregoing explanation. In FIG. 7, only the term "radical" is used.

Figure 8:
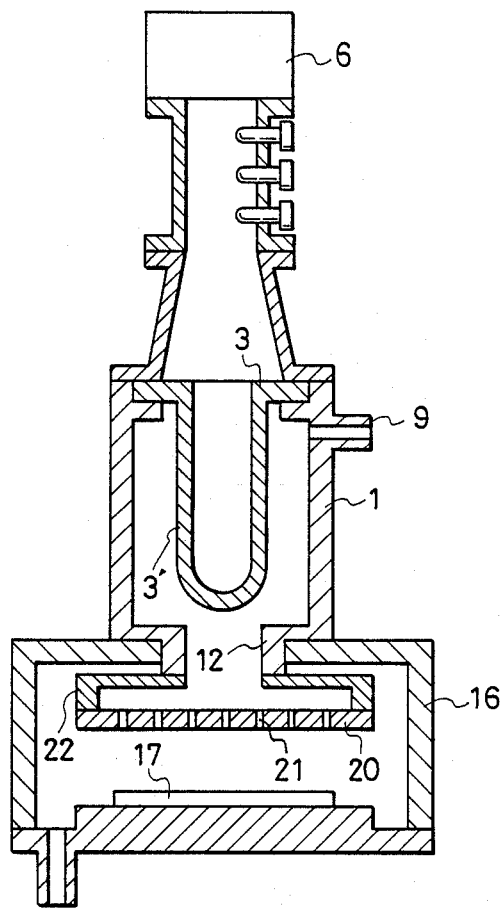
FIG. 8 is a sectional view of side elevation of the third embodiment of the present invention.

In FIG. 8, the third embodiment of the present invention is illustrated. Structure of the activating chamber 1 is the same as that in the second embodiment (FIG. 6). In place of the magnets provided at the external circumference of the transportation pipe 12, the blowing portion 22 is provided at the exit of the transportation pipe 12. This is formed to be located above the sample 17 within the reactor chamber 16. The blowing portion 22 also provides a blowing plate 20 having many small holes 21 at the surface opposed to the sample 17. Moreover, structure of the microwave source 6 and reactor chamber is the same as that of the embodiment illustrated in FIG. 6.

With such structure, as in the case of the first embodiment, the high density reactive gas is transported to the sample. Here, it can be prevented that the charged particles in the activated gas flows into the reactor chamber 16 through the small holes 21 by setting the size of small holes 21, particularly the hole diameter and length of hole of the blowing plate 20 of the blowing portion 22 coupled to the transportation pipe 12 to the predetermined values. Moreover, the uniform and high concentration neutral activated reactive gas ambience can be obtained above the sample 17 by almost uniformly setting many small holes 21 for the unit area of sample 17.

As described above, according to the third embodiment of the present invention, the charged particles can be eliminated from the activated reactive gas and only the neutral activated reactive gas can be uniformly supplied to the entire part of sample within the short distance and with high concentration. Therefore, the resist film on the VLSI element can be uniformly oxidized without damage on the element.

Figure 9:
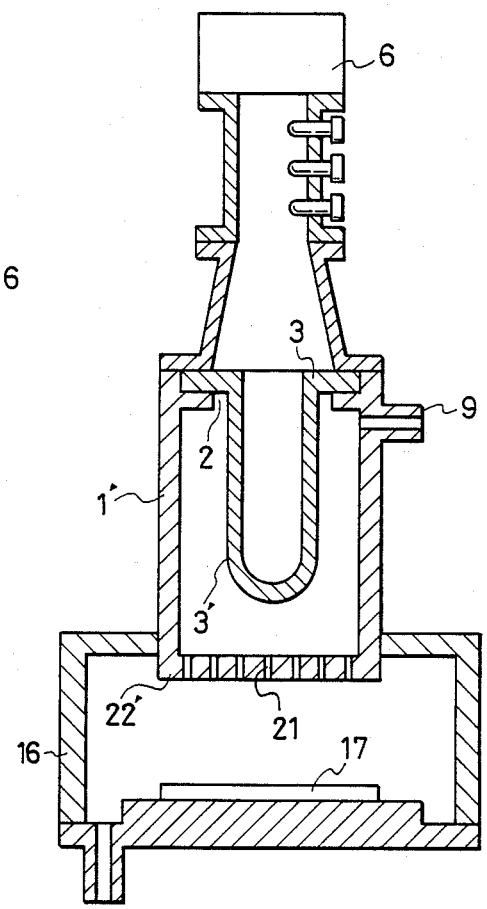
FIG. 9 is a sectional view of side elevation of the fourth embodiment of the present invention.

FIG. 9 is the fourth embodiment of the present invention wherein many small through holes 21 are provided to the bottom of the activating chamber 1'. In this case the activating chamber 1' is provided so that the small holes 21 provided at the bottom thereof are opposed to the sample 17. Moreover, structure of the microwave source 6, microwave introducing member 3 and reactor chamber 16 is the same as that in the second and third embodiments.

This fourth embodiment provides the effect that distance to the sample can be varied or more shortened by forming the bottom surface of activating chamber with the blowing portion 22' having many small through holes.

In summary, the present invention assures stable generation of high density plasma and realizes sufficient excitation and ionization of gas introduced while keeping high density of plasma. Since only the neutral activated reactive gas is transported onto the sample by the charged particle eliminating means, plasma does not give any damage on the sample and high speed oxidization can be realized by plasma without any contamination by impurity.

Accordingly, productivity of plasma processing apparatus can be improved and moreover stability, uniformity of plasma processing and yield of sample can also be improved.

In the present invention, it is a technical subject to avoid damage on the sample by charged particles, but it is of course possible to employ the present invention without providing charged particle eliminating means in such a technical field as allowing damage by charged particles.

What is claimed is:

1. A chemical vapor processing apparatus for chemically reacting on a sample by using a neutral activated reaction gas comprising:

a source of microwave energy;

an activating chamber having a gas pressure not less than about 0.1 Torr which forms a cavity resonator for microwave energy and has an inlet for receiving reactive gas and an outlet for plasma including activated gas produced within said chamber;

means including a waveguide connected between said source and said chamber for transmitting said microwave energy to said chamber;

a window member that is transparent to the microwave energy provided on an end of said waveguide to seal the waveguide from gas pressure in said activating chamber, said window having a cylindrical shape with a major axis protruding into the activating chamber in the direction of microwave energy propagation and a large surface area shaped to form on the inside of said activating chamber a gap between an exterior surface of the window member and an interior wall surface of the activating chamber, said gap being less than 100 mm;

means for supplying reactive gas to the activating chamber so as to flow along said gap whereby high density plasma can activate said reactive gas to produce an activated gas which is directed toward said chamber outlet;

a reaction chamber including a gas exhaust adapted to contain a sample having a surface to be treated by said activated gas from said activating chamber; and means for transporting the activated gas from the outlet of the activating chamber into the reaction chamber including means for trapping charged particles from said activated gas to provide a neutral activated gas for treating a sample.

2. A chemical vapor processing apparatus according to claim 1, further including magnetic means on the exterior of said activating chamber for generating cusp magnetic fields closing on a surface of an internal wall of the activating chamber and effective for suppressing sputtering at the internal walls by charge particles in the plasma.

3. A chemical vapor processing apparatus according to claim 1, wherein said trapping means comprises means for generating magnetic force lines which are substantially perpendicular to the direction of the flow of said activated gas through said transporting means.

4. A chemical vapor processing apparatus for chemically reacting on a sample by using a neutral activated reaction gas comprising:

a source of microwave energy;

an activating chamber having a gas pressure not less than about 0.1 Torr which forms a cavity resonator for microwave energy and has an inlet for receiving reactive gas and an outlet for plasma including activated gas produced within said chamber;

means including a waveguide connected between said source and said chamber for transmitting said microwave energy to said chamber;

a window member that is transparent to the microwave energy provided on an end of said waveguide to seal the waveguide from the activating chamber, said window member having a protuberance including a wall portion which extends into the activating chamber in the direction of microwave energy propagation to provide a large window surface area inside the activating chamber, said wall portion being closely spaced and generally parallel to an interior wall of said activating chamber to form a gap that is effective to receive said reactive gas to produce a high density plasma and maintain a plasma condition as the activated gas moves to the chamber outlet;

a reaction chamber including a gas exhaust adapted to contain a sample having a surface to be treated by gas that has been activated in said activating chamber; and means for transporting the activated gas from the outlet of the activating chamber into the reaction chamber including means for trapping charged particles from said activated gas to provide a neutral activated gas for treating a sample.

5. A chemical vapor processing apparatus according to claim 4, further including magnetic means on the exterior of said activating chamber for generating cusp magnetic fields closing on the surface of an internal wall of the activating chamber to suppress sputtering at the internal wall by charged particles in the plasma.

6. A chemical vapor processing apparatus according to claim 4, wherein said trapping means comprises means for generating magnetic force lines which are substantially perpendicular to the direction of the flow of said activated gas through said transporting means.

7. A chemical vapor processing apparatus according to claim 4, wherein the gap has a dimension less than 100 mm.

* * * * *